United States Patent
Shim et al.

(10) Patent No.: US 7,667,453 B2
(45) Date of Patent: Feb. 23, 2010

(54) TEST TRAY FOR TEST HANDLER

(75) Inventors: Jae Gyun Shim, Suwon-si (KR); Yun Sung Na, Cheonan-si (KR); In Gu Jeon, Suwon-si (KR); Tae Hung Ku, Suwon-si (KR); Hyun Jun Yoo, Suwon-si (KR)

(73) Assignee: Techwing Co., Ltd., Hwaseong-Si, Gyeonggi-Do (KR)

( * ) Notice: Subject to any disclaimer, the term of this patent is extended or adjusted under 35 U.S.C. 154(b) by 0 days.

(21) Appl. No.: 12/170,648

(22) Filed: Jul. 10, 2008

(65) Prior Publication Data

US 2008/0272764 A1    Nov. 6, 2008

Related U.S. Application Data

(63) Continuation of application No. PCT/KR2007/000935, filed on Feb. 22, 2007.

(30) Foreign Application Priority Data

Feb. 24, 2006    (KR) .................... 10-2006-0018087

(51) Int. Cl.
  *G01R 31/28*    (2006.01)

(52) U.S. Cl. ................................... 324/158.1
(58) Field of Classification Search .................. 206/712
  See application file for complete search history.

(56) References Cited

U.S. PATENT DOCUMENTS 6,651,817 B2 * 11/2003 Shim et al. .................. 206/726

FOREIGN PATENT DOCUMENTS

| JP | 06-308157 | 11/1994 |
|---|---|---|
| JP | 10-019975 | 1/1998 |
| KR | 2003-0029266 | 4/2003 |

* cited by examiner

*Primary Examiner*—Ha Tran T Nguyen
*Assistant Examiner*—Roberto Velez
(74) *Attorney, Agent, or Firm*—BainwoodHuang

(57) ABSTRACT

The present invention relates to a test tray for a test handler. According to this invention, there is disclosed a technique that an insert loaded in a loading part which is arranged in a matrix pattern in a frame of the test tray allows an amount and direction of free movement thereof to be determined in accordance with a location of the loading part, where the insert is loaded, on the matrix, thereby enabling a thermal expansion or contraction of a match plate or the test tray to be compensated.

14 Claims, 11 Drawing Sheets

TEST TRAY FOR TEST HANDLER

This application is a Continuation Application of PCT International Application No. PCT/KR2007/000935 filed on Feb. 22, 2007, which designated the United States.

FIELD OF THE INVENTION

The present invention relates to a test tray for a test handler.

BACKGROUND OF THE INVENTION

In general, a test handler supports semiconductor devices, which are fabricated by a preset manufacturing process, to be tested by a tester while moving the semiconductor devices through a fixed route. And, the test handler sorts the semiconductor devices into several classes in accordance with test results thereof. Such a test handler has been already known through a plurality of opened documents.

Figure 1:
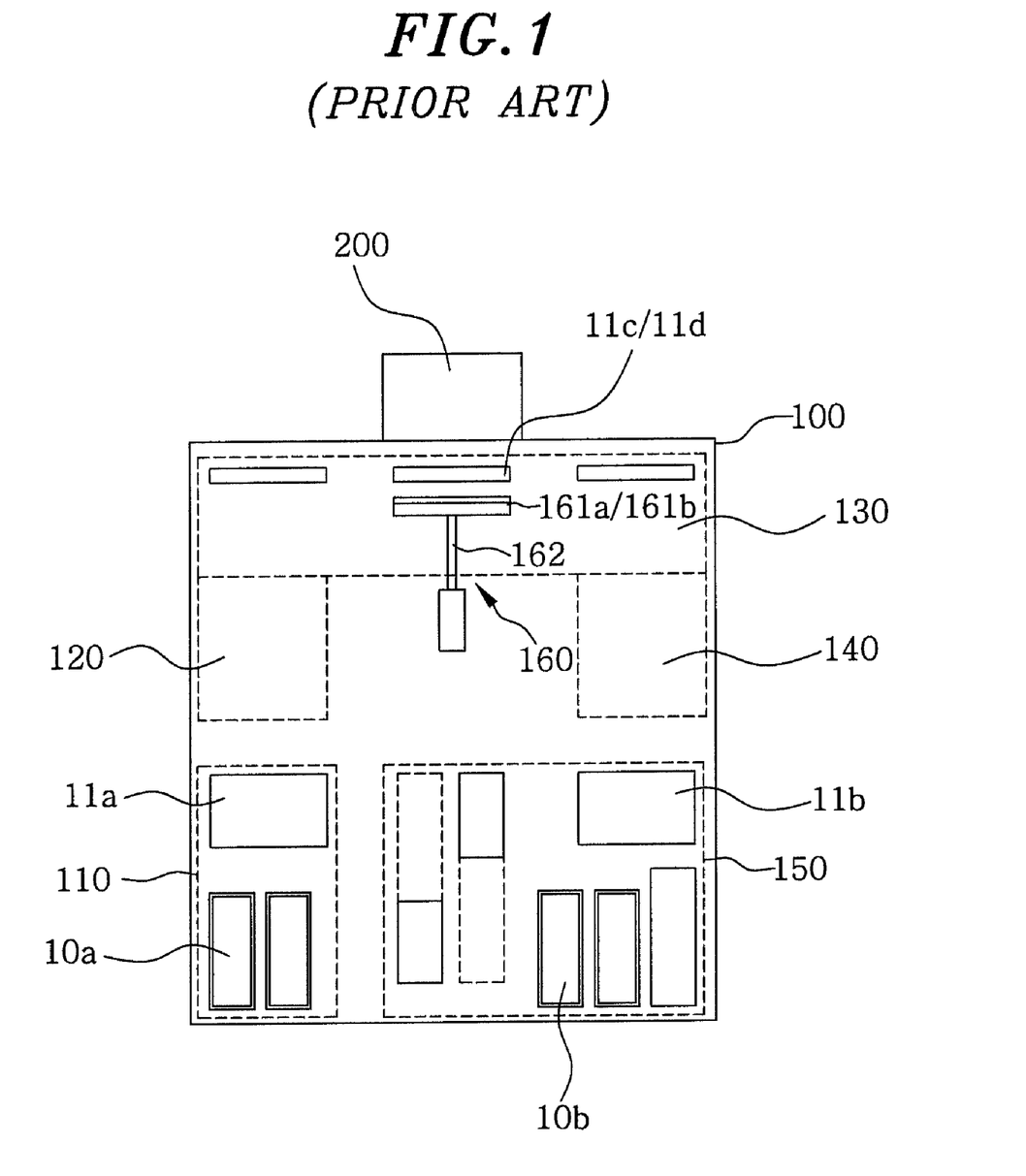
FIG. 1 is a schematic plan view of a test handler and a tester docked to a corresponding test handler.

FIG. 1 is a conceptual plan view for a test handler 100 and a tester docked to the corresponding test handler 100.

Referring to FIG. 1, the test handler 100 includes a loading unit 110, a soak chamber 120, a test chamber 130, a desoak chamber 140, an unloading unit 150 and a pushing unit 160. And, a tester 200 is disposed behind the test chamber 130.

Figure 2:
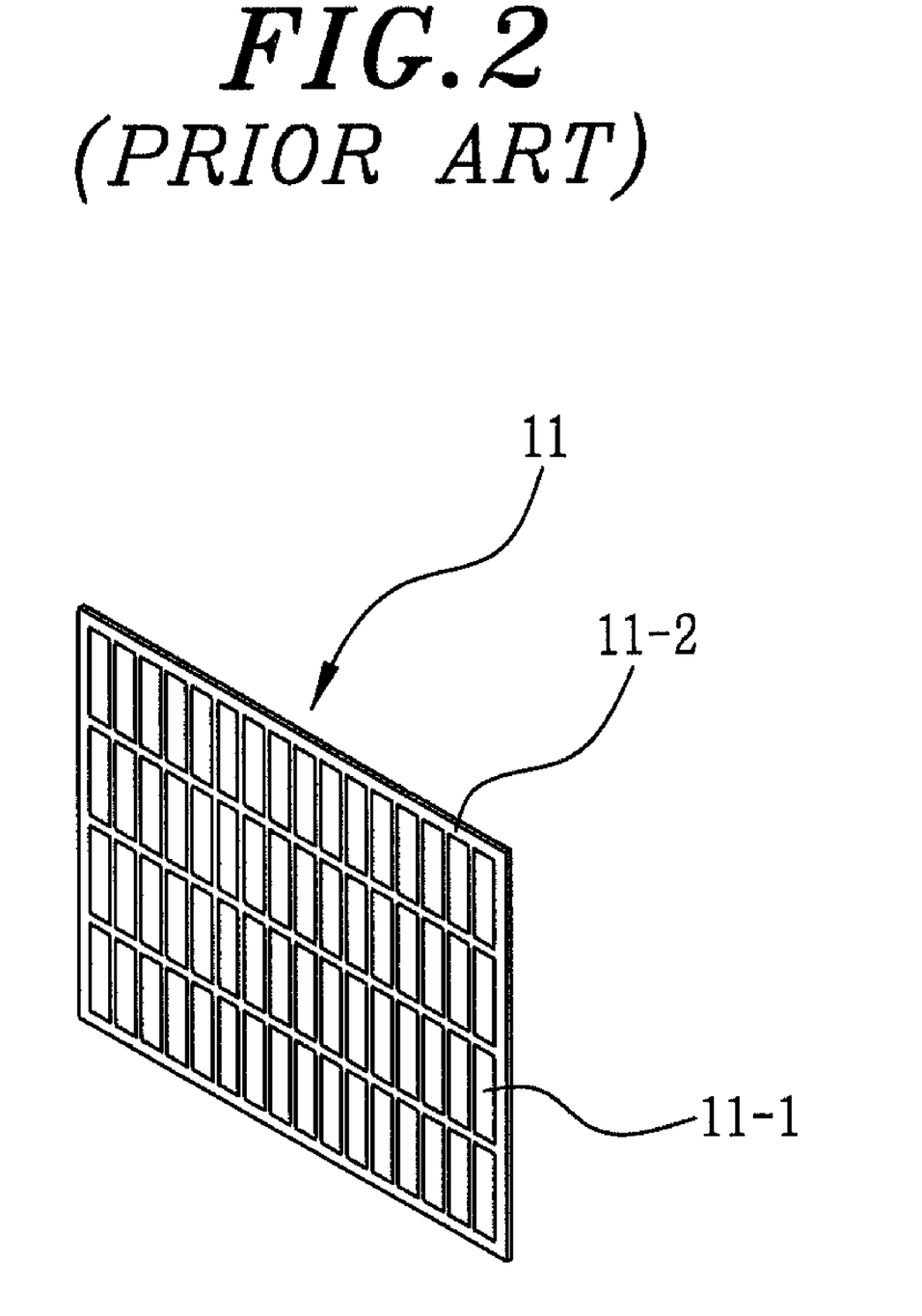
FIG. 2 is a schematic perspective view of a test tray.

The aforementioned test handler 100 moves the semiconductor devices in the order of the soak chamber 120 and the test chamber 130, where a preset temperature environment is made. After the test handler supports the semiconductor devices to be tested by the tester 200 in the test chamber 130, the semiconductor devices that the tests have been completed are moved to the desoak chamber 140 to return to a normal temperature. At this moment, a test tray 11, as shown in a schematic diagram of FIG. 2, is provided as a carrier for supporting to move and to test a plurality of semiconductor devices at the same time. Referring to FIG. 2, the test tray 11 includes a number of inserts 11-1 arranged in a matrix pattern so as to accommodate the semiconductor devices; a frame 11-2 where loading parts for loading the inserts 11-1 are arranged in a matrix pattern; and combining units for keeping the inserts 11-1 in the loading parts as described later. As such a test tray 11 is provided, an operation of loading the semiconductor devices from a customer tray of the reference numeral 10a to a test tray of the reference numeral 11a is carried out in the loading unit 110, and an operation of unloading the semiconductor devices from a test tray of the reference numeral 11b to a customer tray of the reference numeral 10b is carried out in the unloading unit 150. And, the test tray 11 circulates through the loading unit 110, the soak chamber 120, the test chamber 130, the desoak chamber 140 and the unloading unit 150, i.e, by the circulation of the test tray 11, the semiconductor devices loaded on the test tray 11 are unloaded after moving through the route of the soak chamber 120, the test chamber 130 and the desoak chamber 140. For reference, the test tray 11 circulates through a preset circulation route as described above, but for the sake of convenience in the explanation of FIGS. 1 and 4, the reference numeral of the test tray 11 is marked as 11a, 11b, 11c, 11d corresponding to the points where the test tray 11 is located in the route of the test tray 11.

Figure 3:
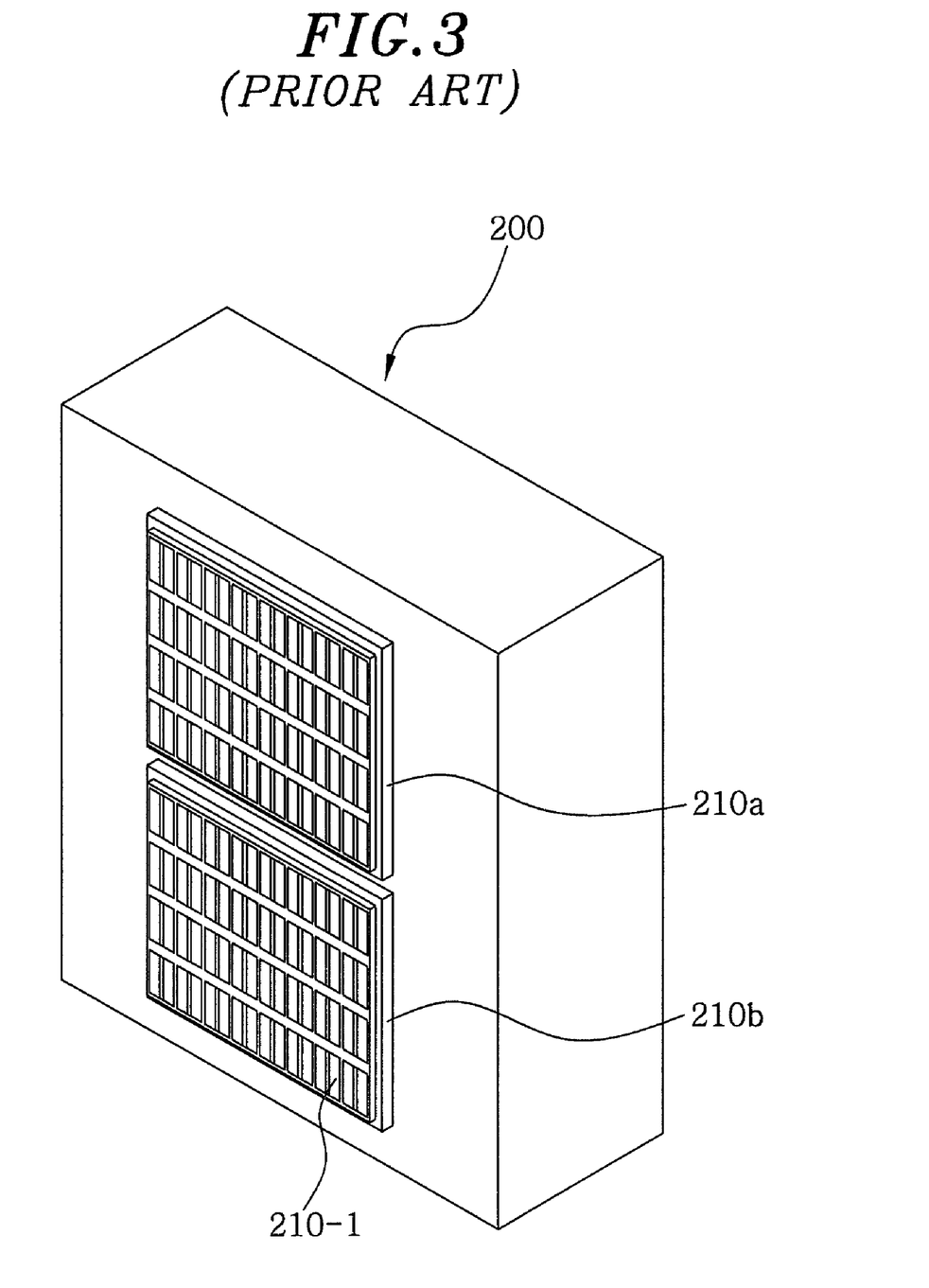
FIG. 3 is a schematic perspective view of the tester of FIG. 1.
Figure 4:
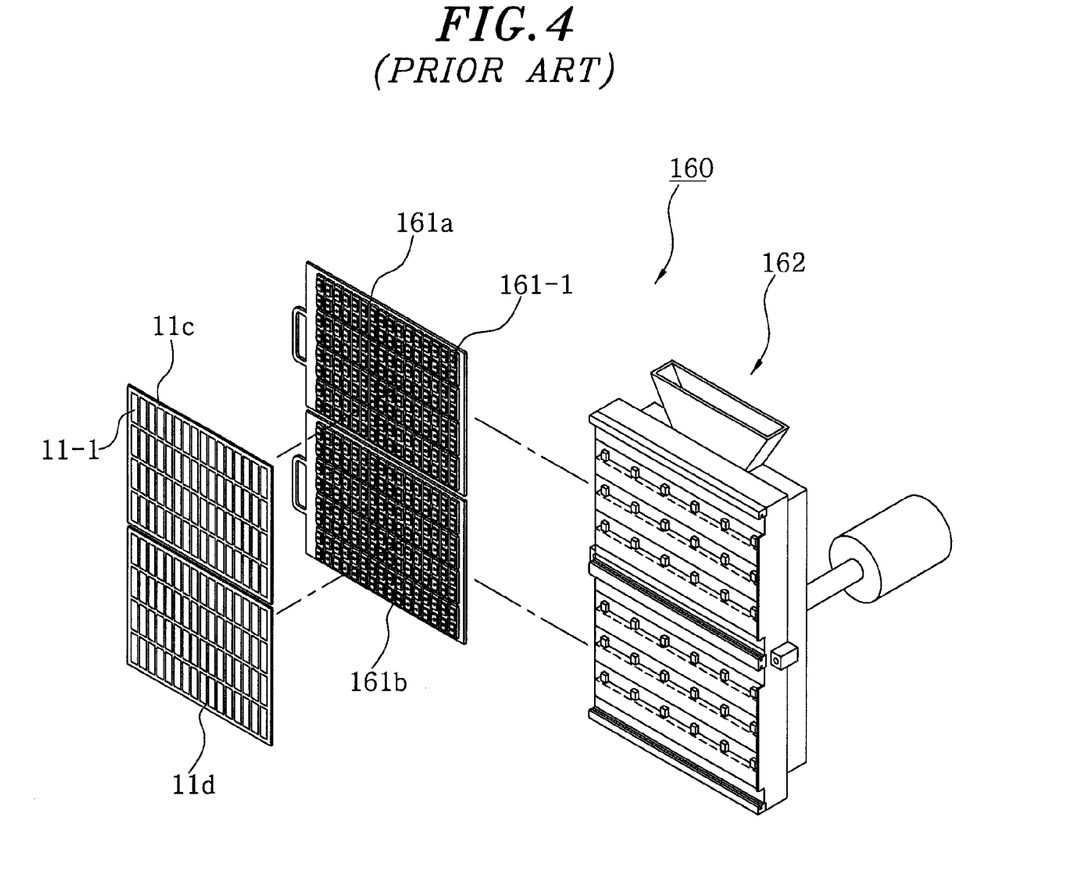
FIG. 4 is a schematic perspective view of a pushing unit applied in FIG. 1.

On the other hand, the tester 200, as shown in the schematic diagram of FIG. 3, includes two inspection substrates named Hi-Fix boards 210a, 210b, and a plurality of sockets 210-1 corresponding to the inserts 11-1 of the test tray 11 are arranged in a matrix pattern on the Hi-Fix boards 210a, 210b. And, a test terminal (not shown) is exposed through each socket 210-1. Accordingly, as shown in FIG. 1, the leads of the semiconductor devices loaded on the test trays (two test trays are disposed in upper and lower stages) of the reference numeral 11c and 11d located on the test chamber 130 are in contact with the test terminals of the sockets 210-1, respectively, thereby carrying out the test. In order to make the leads (or ball grid) of the semiconductor devices loaded on the test trays 11c, 11d contact with the test terminals of the sockets 210-1, the aforementioned pushing unit 160 is provided. That is, in order to make the leads of the semiconductor devices contact with the test terminals of the sockets 210-1 by pressing the semiconductor devices of the test trays against the sockets 210-1 of the Hi-Fix boards 210a, 210b, the aforementioned pushing unit 160 includes match plates 161a, 161b facing the test trays 11c, 11d; and a press unit 162 for pressurizing the match plates 161a, 161b, as shown in FIG. 1 and FIG. 4. Pushers 161-1 corresponding to the inserts 11-1 of the test trays 11c, 11d are arranged in a matrix pattern on the match plates 161a, 161b.

Figure 5:
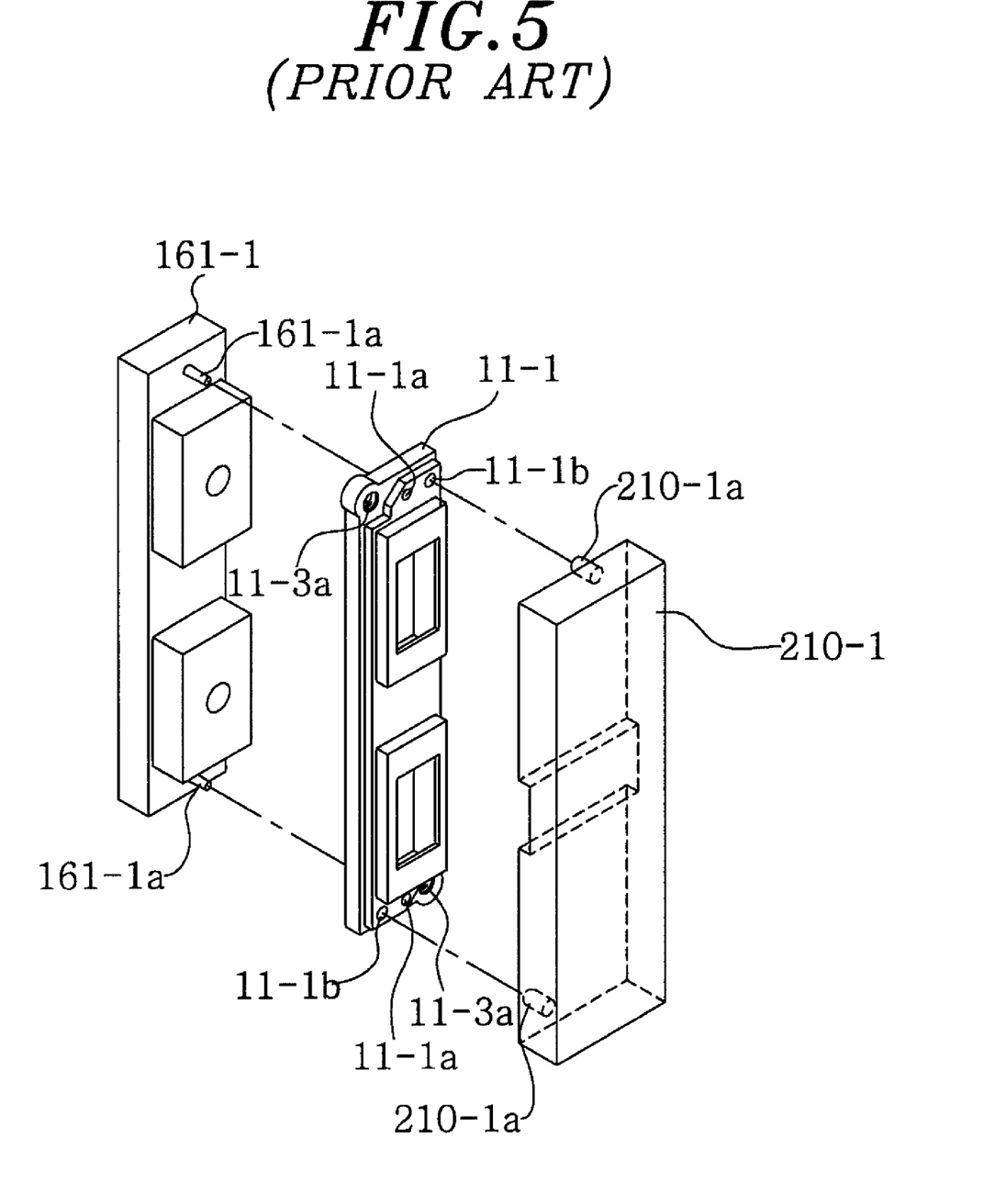
FIG. 5 is a reference perspective view for explaining a combination relationship of a pusher formed in the pushing unit of FIG. 4, an insert formed in the test tray of FIG. 2, and a socket formed in the tester of FIG. 3.

FIG. 5 is an extracted perspective view illustrating one of the sockets 210-1 of the Hi-Fix boards 210a, 210b, the inserts 11-1 and the pushers 161-1 as explained above. Referring to FIG. 5, when applying pressure, a guide pin 161-1a of the pusher 161-1 is first inserted into a pusher guide hole 11-1a of the insert 11-1, and then a guide pin 210-1a of the socket 210-1 is inserted into a socket guide hole 11-1b of the insert 11-1 while the insert 11-1 continuously moves to the socket 210-1, thereby making the pusher 161-1, the insert 11-1, and the socket 210-1 combined as a result thereof. Generally, in accordance with the kind of the semiconductor device, the pusher 161-1 can have a structure of directly applying pressure to a semiconductor device or a structure of indirectly applying pressure through the insert 11-1. That is, the route through which the power of the press unit 162 is actually transmitted can be the pusher 161-1→the semiconductor device→the insert 11-1→the socket 210-1; or the pusher 161-1→the insert 11-1→the semiconductor device→the socket 210-1. In order to make the combination of the pusher 161-1, the insert 11-1 and the socket 210-1 appropriately carried out, the guide pin 161-1a of the pusher 161-1 and the pusher guide hole 11-1a of the insert 11-1 are to be made to face each other appropriately at the corresponding locations to each other, and so are the guide pin 210-1a of the socket 210-1 and the socket guide hole 11-1b of the insert 11-1.

On the other hand, the soak chamber 120 and the test chamber 130 has an inferior temperature environment for testing the semiconductor devices, thus the match plates 161a, 161b or the test trays 11c, 11d are thermally expanded or contracted under the influence of the temperature. But, the match plates 161a, 161b and the test trays 11c, 11d are generally made of materials of which the thermal expansion coefficients are different from each other, thus the extents of the thermal expansion or contraction thereof are different. Accordingly, such thermal expansion or contraction acts as a factor that obstructs the guide pin 161-1a of the pusher 161-1 and the pusher guide hole 11-1a of the insert 11-1 to appropriately face each other. If a pushing operation is carried out while the test trays 11c, 11d or the match plates 161a, 161b are thermally expanded or contracted, thereby making the guide pin 161-1a of the pusher 161-1 not inserted into the pusher guide hole 11-1a of the insert 11-1 correctly, then the insert 11-1 might be damaged and ultimately a loose contact between the lead of the semiconductor device and the test terminal of the socket 210-1 might be happened.

Accordingly, in order to overcome such a problem, the insert 11-1 is made to freely move in all directions within the preset limits on the frame 11-2 of the test tray 11, and the contactability of the semiconductor device and the test terminal can be improved through such a freely moving structure. Concretely, if the insert 11-1 can move freely against the frame 11-2 of the test tray 11, the guide pin 161-1*a* of the pusher 161-1 and the pusher guide hole 11-1*a* of the insert 11-1 face each other within the limits in which compensation can be made through the free movement of the insert 11-1 even though the test tray 11 or the match plate 161*a* or 161*b* is thermally expanded or contracted, thus it is easy to make a combination relationship of the pusher 161-1-insert 11-1-socket 210-1.

Figure 6:
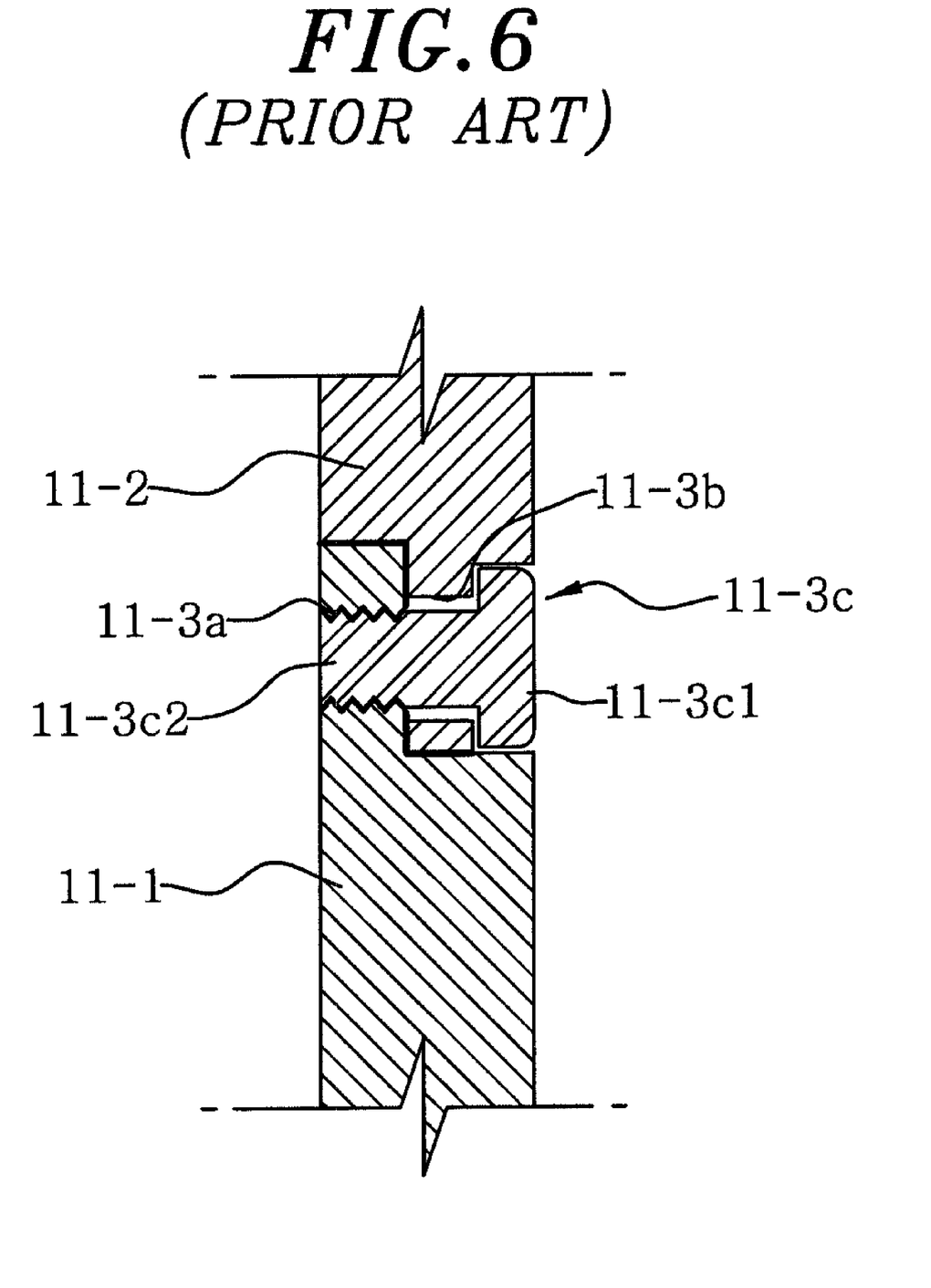
FIG. 6 is a reference cross-sectional view for explaining a combination structure of an insert and a frame in the test tray of FIG. 2.
Figure 7:
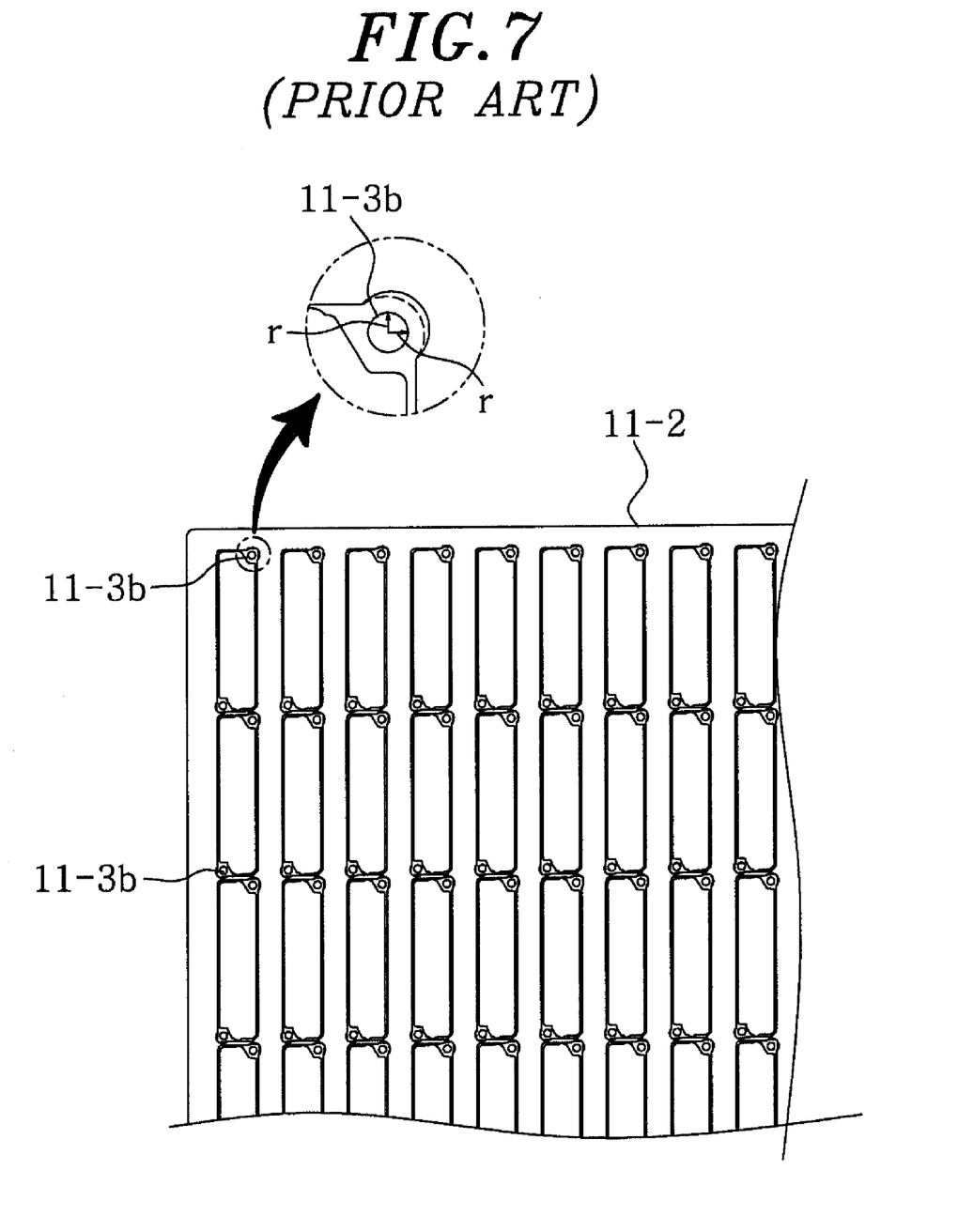
FIG. 7 is a plan view of a frame applied to the test tray according to the prior art.

FIG. 6, as described above, is a cross sectional view conceptually illustrating a structure where the insert 11-1 is combined to the frame 11-2 of the test tray 11 by a combining unit so as to be able to move freely. As in FIG. 6, the combining unit includes a bolt combining hole 11-3*a* (also, see FIG. 5) formed in the insert 11-1; a bolt penetration hole 11-3*b* formed in the frame 11-2 of the test tray 11; and a bolt 11-3*c*. And, the insert 11-1 is combined to the frame 11-2 of the test tray 11 through the bolt 11-3*c* so as to be able to move freely. To more concretely describe the combination structure where the insert 11-1 can move freely, for example, as in FIG. 6, the bolt penetration hole 11-3*b* having a diameter larger than the external diameter of the bolt 11-3*c* is formed in the frame 11-2 of the test tray 11, and the bolt combination hole 11-3*a* is formed in the insert 11-1. And then, a head 11-3*c*1 being one end of the bolt 11-3*c* is made to be caught by the bolt penetration hole 11-3*b* and the extended other end of the bolt 11-3*c*, i.e., a male screw end 11-3*c*2, passes through the bolt penetration hole 11-3*b* with room and then is combined to the bolt combining hole 11-3*a* of the insert 11-1. Thus, ultimately, the insert 11-1 is installed to the frame 11-2 of the test tray 11 to be able to move freely. For reference, as in FIG. 7, the bolt penetration holes 11-3*b* formed in the frame 11-2 of the test tray 11 of the prior art are all formed in a circle shape having the same diameter 'r', thus the insert located around the center of the test tray and the insert located around the outer part of the test tray all have the same free movement limits.

On the other hand, the test tray 11 of the prior art has 32 or 64 inserts 11-1, thus the test tray 11 is relatively of small size. And, the test temperature has been from 30° C. below zero to 125° C. above zero, thus the thermal expansion or contraction of the test tray 11 or the match plate 161*a*, 161*b* can be compensated even only with the aforementioned free movement structure.

However, recently, as the one-time processing capacity of a tester is improved, it is required to make the test tray and the match plate corresponding thereto in a large size so that as many semiconductor devices as possible can be tested at a time. And, it is a trend that the test temperature is also required to be a low temperature of below −45° C. or a high temperature of above 135° C. In this case, the extent of the thermal expansion or contraction of the match plate and the test tray, i.e., the extent of location change of the pusher of the match plate and insert of the test tray, is made larger (recall the edge of the match plate or test tray) as the test tray and the match plate are made in a large size. Such extent of location change is more greatly amplified by a worsened temperature condition. Therefore, the relative location difference of the pusher and the insert corresponding to such a location change also becomes larger. The relative location difference of the insert and the pusher becomes larger as it goes to the outer part of the test tray or the match plate.

Accordingly, in consideration of the outer part of the test tray or the match plate, in case that a large-sized test tray is applied under the inferior temperature condition newly required, it is inevitable for the loose contact between the semiconductor devices and the test terminals or the damages of the inserts to take place because the thermal expansion or contraction of the test tray or the match plate cannot sufficiently compensated only with the aforementioned insert free movement structure. And, such a problem means that the number of the semiconductor devices that can be processed at a time should be limited thereto.

SUMMARY OF THE INVENTION

It is, therefore, a primary object of the present invention to provide a technique that inserts arranged in a matrix pattern in a test tray can have amounts of free movements determined in accordance with their locations on the matrix.

It is another object of the present invention to provide a technique that inserts arranged in a matrix pattern in a test tray can have free movement directions determined in accordance with their locations on the matrix.

It is still another object of the present invention to provide a technique that, among inserts arranged in a matrix pattern in a test tray, amounts of free movements of the inserts arranged in the outer part thereof are made to be greater than those of the inserts arranged around the center thereof.

In accordance with a first embodiment of the present invention, there is provided a test tray for a test handler, including: a frame having a plurality of loading parts arranged in a matrix pattern; at least one insert loaded in each of the loading parts of the frame; and a combining unit for keeping the insert within the loading part to move freely on a plane of the frame, restricting the maximum amount and direction of free movement of the insert, and allowing the maximum amount and direction of free movement of the insert to be determined in accordance with a location of the loading part, in which the insert is loaded, on the matrix.

In the test tray for the test handler, the combining unit allows the insert to have the higher amount of free movement as the location of the loading part, where the insert is loaded, on the matrix is further away from the center of the frame on the plane.

In accordance with a second embodiment of the present invention, there is provided a test tray for a test handler, including: a frame having a plurality of loading parts arranged in a matrix pattern; at least one insert loaded in each of the loading parts of the frame; and a combining unit for keeping the insert within the loading part to move freely on a plane of the frame, and allowing the maximum amount of free movement of the insert to be determined in accordance with a location of the loading part, in which the insert is loaded, on the matrix.

In accordance with a third embodiment of the present invention, there is provided a test tray for a test handler, including: a frame having a plurality of loading parts arranged in a matrix pattern; at least one insert loaded in each of the loading parts of the frame; and a combining unit for keeping the insert within the loading part to move freely on a plane of the frame, and allowing the direction of free movement of the insert to be determined in accordance with a location of the loading part, in which the insert is loaded, on the matrix.

In accordance with a fourth embodiment of the present invention, there is provided a test tray for a test handler, including: a frame having a plurality of loading parts arranged in a preset matrix pattern; at least one insert loaded in each of the loading parts of the frame; and a combining unit for keeping the insert within the loading part to move freely on a plane of the frame, and allowing the amount of free movement of the insert to be determined to be larger in case that the insert is loaded in the loading part arranged to be closest to the outer part of the frame than in case that the insert is loaded in the loading part arranged to be closest to the center of the frame on the plane.

In the test tray for the test handler, the combining unit allows the amount of free movement of the insert to be determined to be larger as the insert is arranged further away from the center of the frame on the plane.

In the test tray for the test handler, the combining unit includes a free movement determining hole which is formed in the frame and has a larger shape as its location is further away from the center of the frame on the plane; and a free movement pin of which one end is caught by the free movement determination hole, and of which the extended other end passes through the free movement determining hole with room so as to be able to move freely, thereby being combined with the insert.

In the test tray for the test handler, the free movement determining hole is made in a shape of an elongated hole which has a tilt in a straight line direction of connecting the formation location thereof to the center of the frame on the plane.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE EMBODIMENTS

Hereinafter, a test tray for a test handler (hereinafter, referred to as "test tray") according to the present invention will be described in detail.

According to an embodiment of the present invention, the direction and amount of free movement of each insert are analyzed on a basis of the center of a test tray and are shown in vector, and a bolt penetration hole formed in a frame is formed in an elongated hole of ellipse having a wide width proportional to the vector. Accordingly, as a result, the bolt penetration hole adjacent to the center of the test tray becomes a hole close to a circle, and the bolt penetration hole adjacent to the corner of the test tray becomes an elongated hole of the wide width which is inclined in a 45° direction and which is close to an ellipse. Further, the bolt penetration hole adjacent to a center of a vertical side of the test tray becomes an elongated hole of the wide width in a horizontal direction, and the bolt penetration hole adjacent to a center of a horizontal side of the test tray becomes an elongated hole of the wide width in a vertical direction.

The embodiment like the above will be described further in detail with reference to the accompanying drawings, but the same components of the prior art will be described being marked with the same reference numerals.

Figure 8:
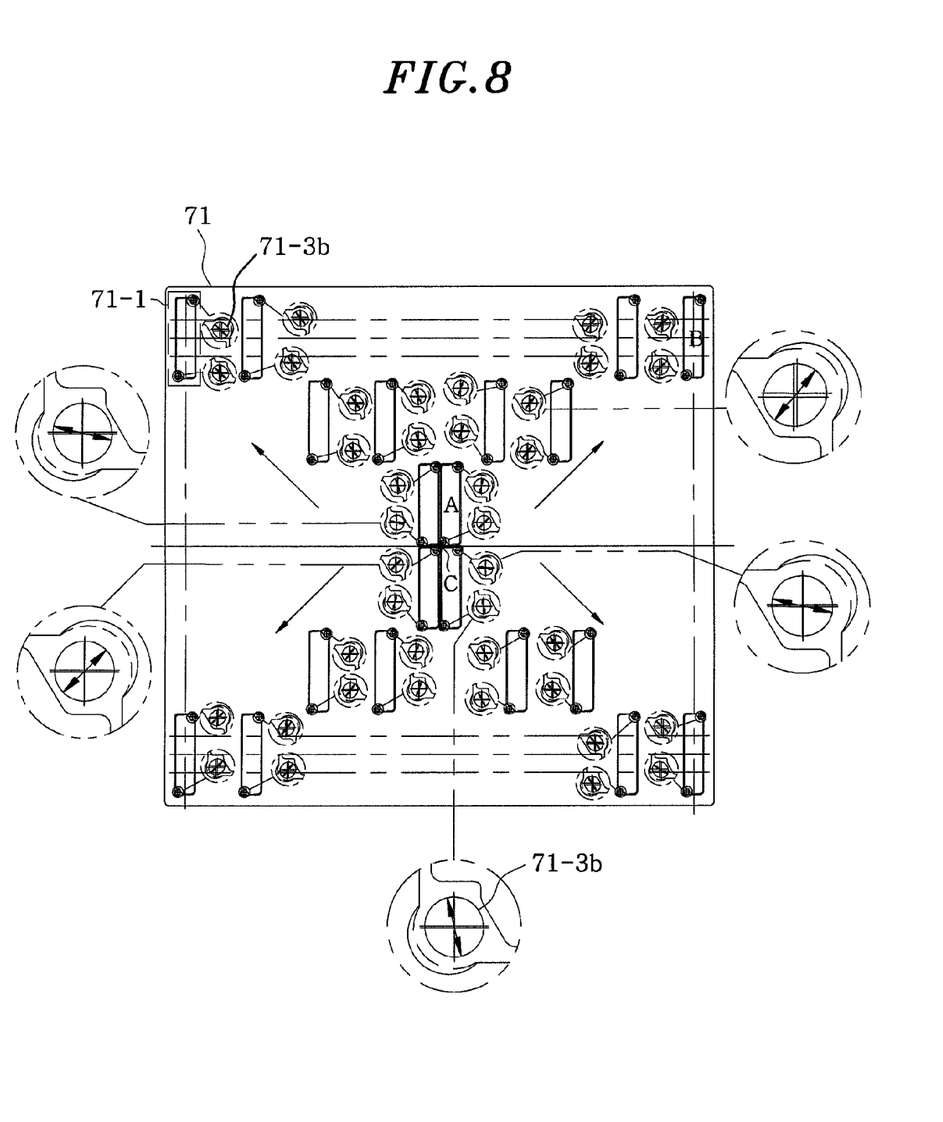
FIG. 8 is a plan view of a frame applied to the test tray according to an embodiment of the present invention.

The test tray according to the present invention includes a frame 71 shown in FIG. 8, inserts 11-1 shown in FIG. 5, a combining unit shown in FIG. 6, and the like.

The frame 71, as shown in FIG. 8, includes a plurality of loading parts 71-1 arranged in a matrix pattern.

Each insert 11-1, as shown in FIG. 5, has pusher guide holes 11-1$a$ and socket guide holes 11-1$b$.

The combining unit includes bolt combining holes 11-3$a$ (see FIGS. 5 and 6) formed in the insert 11-1; bolt penetration holes 71-3$b$ formed in the loading part 71-1 of the frame 71; and a bolt 11-3$c$ (see FIG. 6).

The bolt combining holes 11-3$a$ are diagonally formed in a pair in the insert 11-1, and are combined with extended other ends, i.e., male screw ends 11-3$c$2, of the bolts 11-3$c$. The bolt penetrating holes 71-3$b$, as shown in FIG. 8, are diagonally formed in a pair in each loading part 71-1 of the frame 71 to correspond to the bolt combining holes 11-3$a$, and the male screw ends 11-3$c$2 of the bolt 11-3$c$ passes therethrough. For reference, the bolt penetration holes 71-3$b$ formed in the frame 71 in this embodiment are different in size and gradient direction in accordance with the arrangement location thereof, but are marked as the reference numeral 71-3$b$ for the sake of explanation and drawing transcription.

The bolt 11-3$c$ has its head 11-3$c$1 caught by the bolt penetration hole 71-3$b$, and the extended male screw 11-3$c$2 is combined with the bolt combining hole 11-3$a$ by passing through the bolt penetration hole 71-3$b$. That is to say, the bolt 11-3$c$ makes the insert 11-1 appropriately kept in the loading part 71-1 while installing the insert 11-1 in the frame 71 so as to enable the corresponding insert 11-1 to move freely, and moves freely together with the insert 11-1 while being integrally combined with the insert 11-1, but acts as a free movement pin which guides the free movement of the insert 11-1 in a gradient direction of the bolt penetration hole 71-3$b$.

In order to explain the characteristic of the present invention more clearly in such a configuration, a more detail explanation will be made through reference views inclusive of FIG. 8.

As shown in FIG. 8, a plurality of loading parts 71-1 is arranged in a matrix pattern in the frame 71. And, the bolt penetration holes 71-3$b$ are diagonally formed in a pair in each loading part 71-1, and each bolt penetration hole 71-3$b$ has a different size and shape in accordance with an arrangement location thereof.

Figure 9:
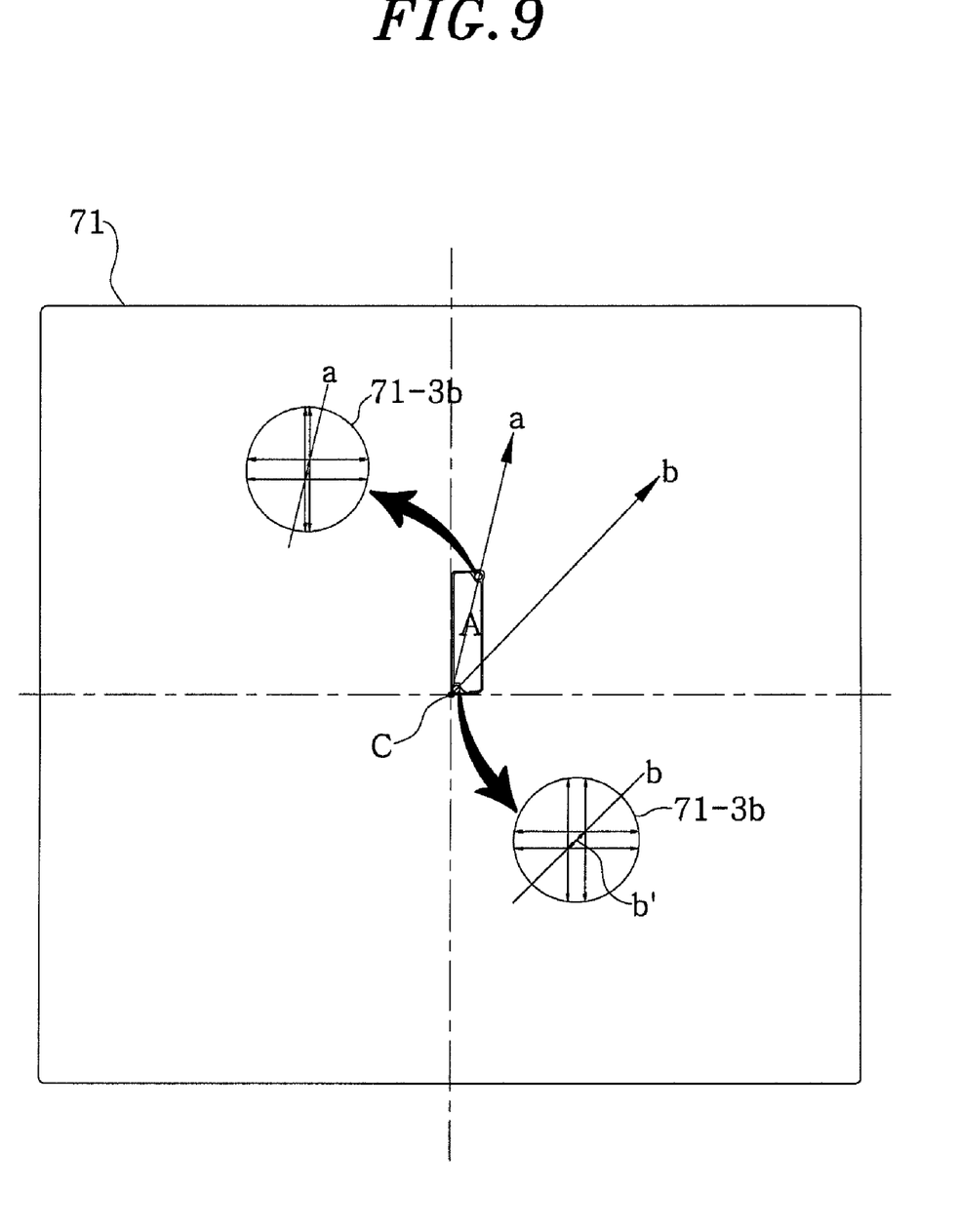
FIGS. 9 to 11 are reference views for explaining the frame of FIG. 8.

For example, if the loading part 71-1 of a part 'A' of FIG. 8 is observed carefully in reference to an explanation view of FIG. 9, it is known that there is formed a bolt penetration hole 71-3$b$ of an elongated hole shape which is longer in a direction (a or b direction) of linearly crossing the center of the bolt penetration hole 71-3$b$ formed in the corresponding loading part 71-1 and the center 'C'. That is to say, the bolt penetration hole 71-3$b$ is nearly of an ellipse shape having a fixed narrow width, but having a wide width formed to be longer by as much as a' or b' in a straight line a or b direction than a narrow width. For more example, if the loading part 71-1 of a part 'B' of FIG. 8 is observed in detail with reference to an explanation view of FIG. 10, there is formed a bolt penetration hole 71-3$b$, which is in an elongated hole shape that is longer in a direction (c or d direction) linearly crossing the center of the bolt penetration hole 71-3b formed in the corresponding loading part 71-1 and the center C. That is, the bolt penetration hole 71-3b is substantially an ellipse shape having a fixed narrow width, but having a wide width that may be longer by as much as c' or d' in a straight line c or d direction than the narrow width.

Figure 11:
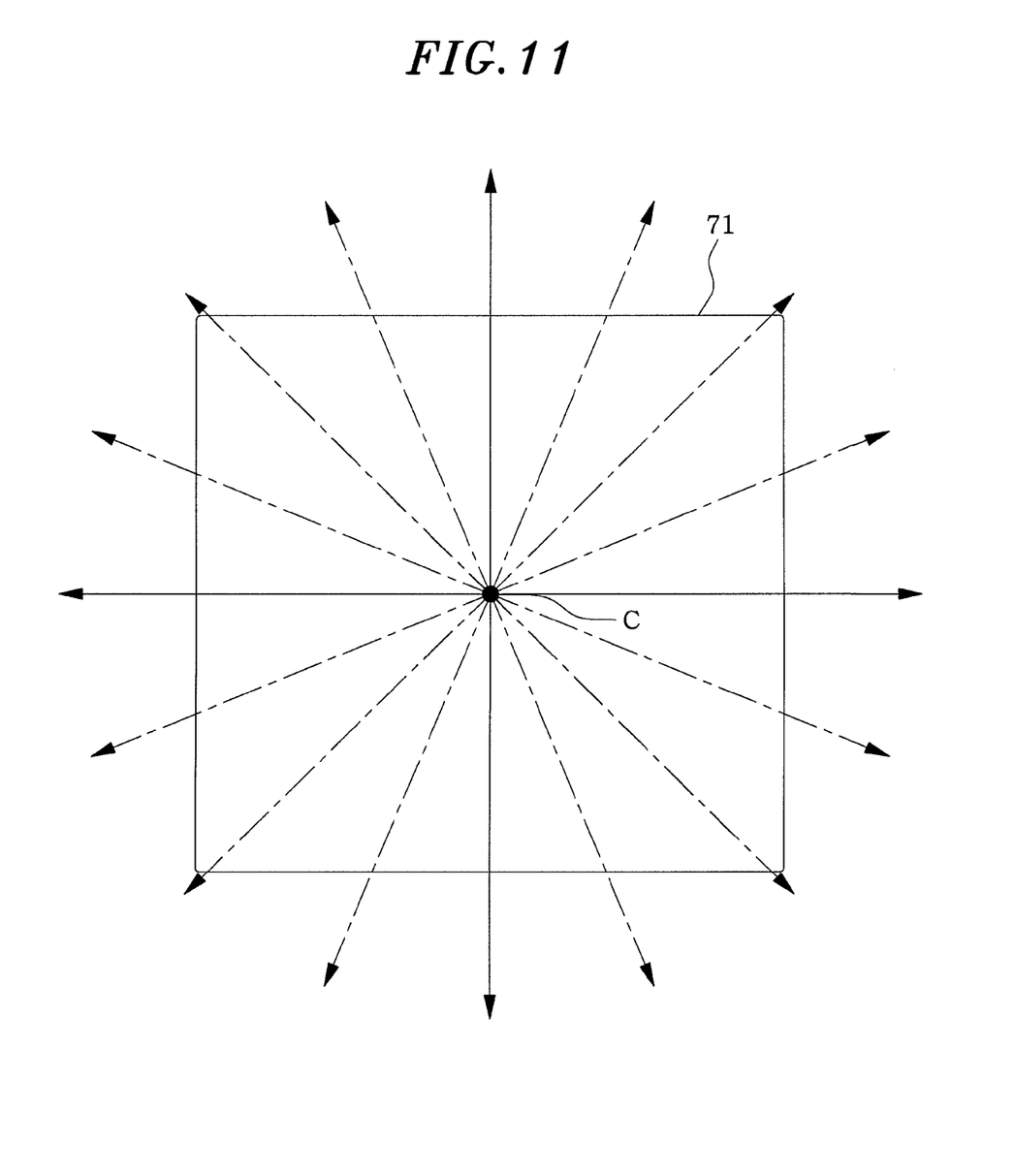

When taking a specific location of the test tray into consideration, a corresponding specific location part is expanded in a specific straight line direction of crossing the center and the corresponding specific location, thus the insert 11-1 is made to have the free movement in the specific straight line direction, but the free movement is made to be restricted in another direction. That is to say, as shown in the reference view of FIG. 11, assuming that there are a lot of straight lines crossing the center of the frame 71, the bolt penetration hole 71-3b located at a point which meets an arbitrary straight line is formed in an elongated hole shape having a gradient in a corresponding arbitrary straight line direction. Accordingly, the bolt penetration hole 71-3b adjacent to the center of the horizontal side of the frame 71 becomes an elongated hole having a wide width in a vertical direction, while the bolt penetration hole 71-3b adjacent to the center of the vertical side of the frame 71 becomes an elongated hole having a wide width in a horizontal direction. And, the bolt penetration hole 71-3b adjacent to the straight line connecting the corner with the center of the frame 71 becomes an elongated hole having a gradient close to about 45° with a horizontal axis or a vertical axis.

Figure 10:
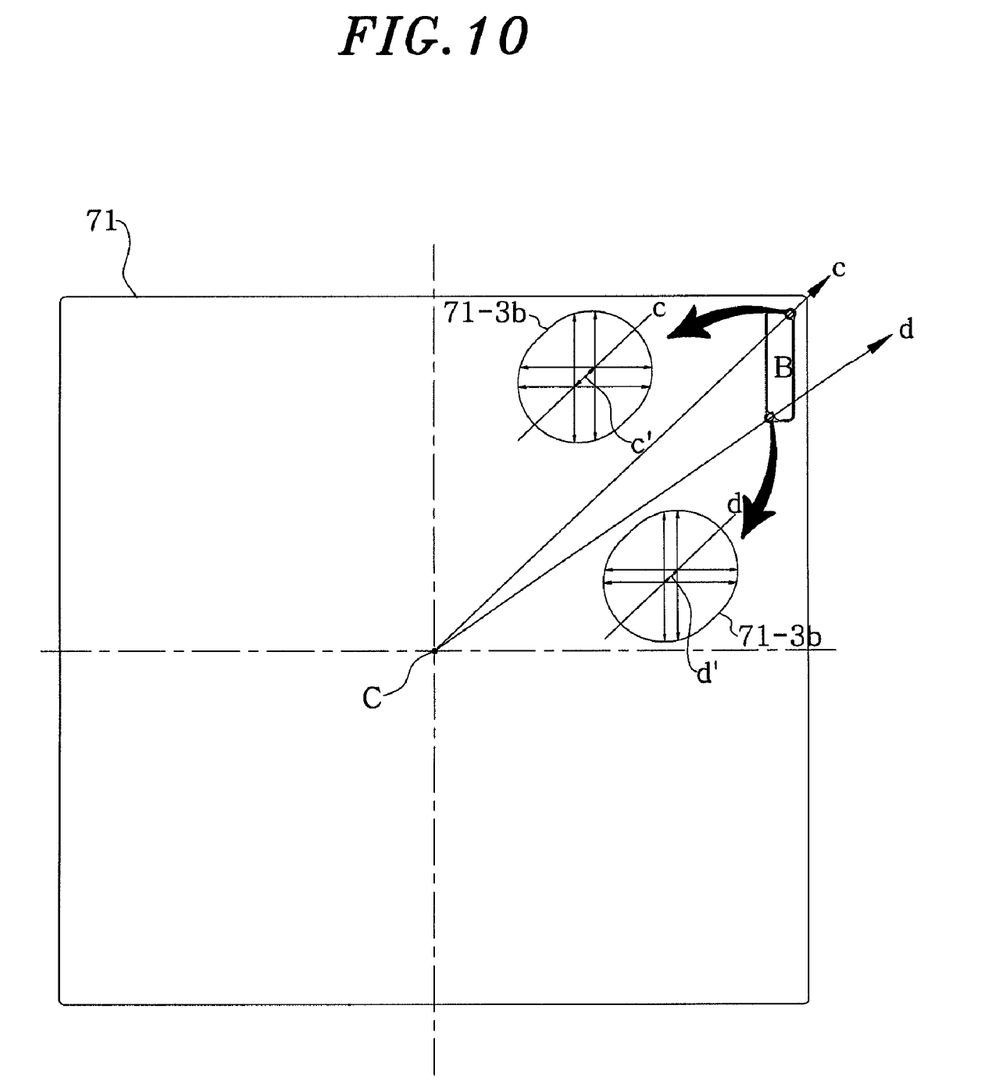

Further, when comparing FIG. 9 with FIG. 10, c' or d' is longer than a' or b', and thus the bolt penetration holes 71-3b shown in FIG. 10 are substantially larger than the bolt penetration holes 71-3b shown in FIG. 9, as a whole. This is because the amount of free movement of the insert 11-1 shown in FIG. 10 needs to be made higher since the extent of thermal expansion or contraction is greater as a point is further away from the center. That is, the bolt penetration hole 71-3b becomes a hole having a wide width close to the narrow width as the bolt penetration hole 71-3b is located closer to the center of the frame 71, while the bolt penetration hole 71-3b becomes an elongated hole having a wide width higher than the narrow width as the bolt penetration hole 71-3b is located further away from the center of the frame 71.

As described above, according to the embodiment of the present invention, as the bolt penetration hole 71-3b is located further away from the center, it is formed to be longer and has an elongated hole shape of which the gradient direction is a straight line direction of connecting the center to the location where the corresponding bolt penetration hole 71-3b is formed. And, the direction and amount of free movement of the insert 11-1 is determined by the bolt penetration hole 71-3b. That is to say, in this embodiment, the bolt penetration hole 71-3b acts as free movement determining hole which determines the direction and amount of free movement of the insert 11-1.

Accordingly, according to the test tray described above, even though the frame 71 of the test tray is excessively expanded or contracted when testing the semiconductor devices at a high temperature or low temperature, each insert 11-1 can move freely by as much as the amount of the corresponding expansion or contraction in a direction against an expansion or contraction direction corresponding to its location, thus the posture and location of the insert 11-1 for the center of the test tray are adjusted to a fixed value regardless of the expansion or contraction of the frame 71.

On the other hand, when observing this invention in a different point of view, the inserts 11-1 located around the outer part of the test tray are known to make greater in the amount of free movement than the insert 11-1 located around the center of the test tray. When seeing in this point of view, the present invention can be explained as follow. When considering two inserts 11-1 which are arranged on an arbitrary straight line of crossing the test tray and different from each other in distance from the center, the insert 11-1 further away from the center is determined to be higher in the amount of free movement than the insert closer to the center. Accordingly, when considering arbitrary two inserts 11-1 that are arranged on one straight line of crossing the center of the test tray, the present invention includes a case of having at least one example that the insert 11-1 far away from the center on an arbitrary straight line is determined to be higher in the amount of free movement than the insert 11-1 closer to the center.

While the invention has been shown and described with respect to the preferred embodiments, it will be understood by those skilled in the art that various changes and modification may be made without departing from the scope of the invention as defined in the following claims.

What is claimed is:

1. A test tray for a test handler, comprising:
   a frame having a plurality of loading parts arranged in a matrix pattern;
   at least one insert loaded in each of the loading parts of the frame; and
   a combining unit for keeping the insert within the loading part to move freely on a plane of the frame, restricting the maximum amount and direction of free movement of the insert, and allowing the maximum amount and direction of free movement of the insert to be determined in accordance with a location of the loading part, in which the insert is loaded, on the matrix.

2. The test tray for a test handler of claim 1, wherein the combining unit allows the insert to have the higher amount of free movement when the location of the loading part, where the insert is loaded, on the matrix is further away from the center of the frame on the plane.

3. The test tray for a test handler of claim 1, wherein the combining unit includes:
   a free movement determining hole formed in the frame and having a larger shape as its location is further away from the center of the frame on the plane; and
   a free movement pin having one end being caught by the free movement determination hole, and the extended other end passing through the free movement determining hole with room so as to be able to move freely, thereby being combined with the insert.

4. The test tray for a test handler of claim 3, wherein the free movement determining hole is made in a shape of an elongated hole which has a tilt in a straight line direction of connecting the formation location thereof to the center of the frame on the plane.

5. A test tray for a test handler, comprising:
   a frame having a plurality of loading parts arranged in a matrix pattern;
   at least one insert loaded in each of the loading parts of the frame; and
   a combining unit for keeping the insert within the loading part to move freely on a plane of the frame, and allowing the maximum amount of free movement of the insert to be determined in accordance with a location of the loading part, in which the insert is loaded, on the matrix.

6. The test tray for a test handler of claim 5, wherein the combining unit includes:

a free movement determining hole formed in the frame and having a larger shape as its location is further away from the center of the frame on the plane; and a free movement pin having one end being caught by the free movement determination hole, and the extended other end passing through the free movement determining hole with room so as to be able to move freely, thereby being combined with the insert.

7. The test tray for a test handler of claim 6, wherein the free movement determining hole is made in a shape of an elongated hole which has a tilt in a straight line direction of connecting the formation location thereof to the center of the frame on the plane.

8. A test tray for a test handler, comprising:
a frame having a plurality of loading parts arranged in a matrix pattern;
at least one insert loaded in each of the loading parts of the frame; and
a combining unit for keeping the insert within the loading part to move freely on a plane of the frame, and allowing the direction of free movement of the insert to be determined in accordance with a location of the loading part, in which the insert is loaded, on the matrix.

9. The test tray for a test handler of claim 8, wherein the combining unit includes:
a free movement determining hole formed in the frame and having a larger shape as its location is further away from the center of the frame on the plane; and
a free movement pin having one end being caught by the free movement determination hole, and the extended other end passing through the free movement determining hole with room so as to be able to move freely, thereby being combined with the insert.

10. The test tray for a test handler of claim 9, wherein the free movement determining hole is made in a shape of an elongated hole which has a tilt in a straight line direction of connecting the formation location thereof to the center of the frame on the plane.

11. A test tray for a test handler, comprising:
a frame having a plurality of loading parts arranged in a preset matrix pattern;
at least one insert loaded in each of the loading parts of the frame; and
a combining unit for keeping the insert within the loading part to move freely on a plane of the frame, and allowing the amount of free movement of the insert to be determined to be larger in case that the insert is loaded in the loading part arranged to be closest to the outer part of the frame than in case that the insert is loaded in the loading part arranged to be closest to the center of the frame on the plane.

12. The test tray for a test handler of claim 11, wherein the combining unit allows the amount of free movement of the insert to be determined to be larger as the insert is arranged further away from the center of the frame on the plane.

13. The test tray for a test handler of claim 11, wherein the combining unit includes:
a free movement determining hole formed in the frame and having a larger shape as its location is further away from the center of the frame on the plane; and
a free movement pin having one end being caught by the free movement determination hole, and the extended other end passing through the free movement determining hole with room so as to be able to move freely, thereby being combined with the insert.

14. The test tray for a test handler of claim 13, wherein the free movement determining hole is made in a shape of an elongated hole which has a tilt in a straight line direction of connecting the formation location thereof to the center of the frame on the plane.

* * * * *